(12) United States Patent
Seidl et al.

(10) Patent No.: US 7,087,485 B2
(45) Date of Patent: Aug. 8, 2006

(54) METHOD OF FABRICATING AN OXIDE COLLAR FOR A TRENCH CAPACITOR

(75) Inventors: Harald Seidl, Feldkirchen (DE); Martin Gutsche, Dorfen (DE); Thomas Hecht, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/765,052

(22) Filed: Jan. 28, 2004

(65) Prior Publication Data

US 2005/0037565 A1 Feb. 17, 2005

(30) Foreign Application Priority Data

Jan. 29, 2003 (DE) ................. 103 03 413

(51) Int. Cl.
 *H01L 21/8242* (2006.01)
(52) U.S. Cl. ...................... 438/243; 438/386
(58) Field of Classification Search ........ 438/243–249, 438/386–392; 257/301–305
 See application file for complete search history.

(56) References Cited

U.S. PATENT DOCUMENTS

| 6,200,873 | B1 * | 3/2001 | Schrems et al. ............ 438/386 |
| 6,500,707 | B1 * | 12/2002 | Schrems .................... 438/249 |
| 6,689,220 | B1 * | 2/2004 | Nguyen ..................... 118/695 |
| 6,777,303 | B1 | 8/2004 | Schrems et al. |

FOREIGN PATENT DOCUMENTS

DE 199 56 078 A1 5/2001

OTHER PUBLICATIONS

Klaus, J.W., et al., "Atomic Layer Deposition of SiO₂ Using Catalyzed and Uncatalyzed Self-Limiting Surface Reactions," Surface Review and Letters, vol. 6, Nos. 3 & 4 (1999) pp. 435-448.
Klaus, J.W., et al., "Growth of SiO₂ at Room Temperature with the Use of Catalyzed Sequential Half-Reactions," Department of Chemistry and Biochemistry, University of Colorado, Boulder, CO (1997).

* cited by examiner

Primary Examiner—Jennifer Kennedy
(74) Attorney, Agent, or Firm—Slater & Matsil, L.L.P.

(57) ABSTRACT

A method for fabricating patterned ceramic layers on areas of a relief structure, wherein the layers may be arranged essentially perpendicular to a top side of a substrate. In exemplary embodiments, a patterned ceramic layer forms an oxide collar for a trench capacitor. The oxide collar is produced by a trench firstly being filled with a resist in its lower section, and an oxide layer subsequently being produced on the uncovered areas of the substrate with the aid of a low temperature ALD method. By means of anisotropic etching, only those portions of the ceramic layer which are arranged at the perpendicular walls of the trench remain. The resist filling may subsequently be removed, for example, by means of an oxygen plasma.

15 Claims, 5 Drawing Sheets

METHOD OF FABRICATING AN OXIDE COLLAR FOR A TRENCH CAPACITOR

BACKGROUND

1. Field of the Invention

The invention relates to a method for fabricating device structures. More particularly it relates to patterning ceramic layers on areas in a relief structure.

2. Background of the Invention

Economic success in the semiconductor industry is substantially influenced by a further reduction of the minimum feature size that can be produced on a microchip. Reducing the minimum feature size makes it possible to increase the integration density of the electronic components such as transistors or capacitors on the microchip and thus to increase the computing speed of processors and also to increase the storage capacity of memory modules.

In order that the area required by the components on the chip surface is kept small, the depth of the substrate is also utilized in the case of capacitors. To that end, a trench is first introduced into a wafer. Afterward, a bottom electrode is produced, for example, by doping the regions of a wafer adjoining the wall of the trench in order to increase the electrical conductivity. A thin layer of a dielectric is then applied to the bottom electrode. Finally, the trench is filled with an electrically conductive material in order to obtain a counter-electrode. The latter electrode is also referred to as top electrode. This arrangement of electrodes and dielectric means that the capacitor is, as it were, folded. Given electrode areas of constant size, that is to say the same capacitance, the lateral extent of the capacitor on the chip surface can be minimized. Such capacitors are also referred to as "Deep Trench" capacitors.

In memory chips, the charged and discharged states of the capacitor correspond to the two binary states 0 and 1. In order to be able to reliably determine the charge state of the capacitor and thus the information stored in the capacitor, the latter must have a specific minimum capacitance. If the capacitance, or in the case of a partly discharged capacitor, the charge, falls below this value, the signal disappears in the noise and the information about the charge state of the capacitor is lost. After writing, the capacitor is discharged due to leakage currents, which bring about a charge balancing between the two electrodes of the capacitor.

In order to counteract a loss of information through the discharge of the capacitor, in DRAMs the charge state of the capacitor is checked at regular intervals and refreshed as needed, such that a partly discharged capacitor is charged again up to an original state. However, technical limits are imposed on these refreshing times, so that the refresh rate cannot be shortened arbitrarily. During the period of the refreshing time, therefore, the charge of the capacitor is permitted to decrease only to an extent such that reliable determination of the charge state is possible. For a given leakage current, the capacitor must therefore have a specific minimum charge at the beginning of the refreshing time, so that at the end of the refreshing time, the charge state is still high enough above the noise to be able to reliably read out the information stored in the capacitor. With decreasing dimensions of the capacitor, the leakage currents increase, as tunneling effects gain in importance.

In order to be able to ensure a reliable storage of information even with advancing miniaturization, the capacitor must have a sufficient capacitance. In order to obtain the desired high capacitance despite a decreasing structural size, a multiplicity of solution approaches are being pursued. As an example, the surface of the electrodes is provided with a structure whose surface is increased to the extent possible, as the length and width of the electrodes decrease. Furthermore, new materials are being investigated to replace the silicon dioxide, which has been used hitherto as the dielectric, with a higher dielectric constant layer.

In order to achieve a highest possible capacitance for a given size of a capacitor, attempts are being made to dope as highly as possible the region of the semiconductor which directly adjoins the dielectric, in order to produce a highest possible surface charge density in the electrode in direct proximity to the dielectric.

In memory chips, a capacitor is connected to a transistor via which the charge state of the capacitor can be controlled. In deep trench capacitors, the transistor is usually arranged above the capacitor. In order to be able to achieve a sufficient electrical insulation between capacitor and transistor, the topmost section of the trench, which is adjoined by the transistor, is not doped. During the fabrication of the deep trench capacitor, therefore, it is necessary to delimit the region in which the semiconductor substrate is intended to be doped. This may be done by filing the trench with a solid form of the dopant to the height of the trench intended to be doped. For example, a trench is firstly filled completely with arsenic glass and the filling is subsequently etched back as far as a depth below which the semiconductor is intended to be doped. Afterward, the semiconductor substrate is heated, so that the arsenic diffuses from the arsenic glass into the surrounding semiconductor. With decreasing dimensions of the trenches, however, a sufficient quantity of dopant cannot be made available by use of arsenic glass. Furthermore, as a result of the depletion of the arsenic glass during the doping operation, as the duration of the heat treatment steps increase, the maximum of the dopant concentration migrates away from the trench wall into the semiconductor.

In order to achieve a sufficiently high doping even in trenches of small dimensions, efforts are shifting to introducing the dopant from the gas phase into the semiconductor. Since a sufficiently high concentration of the dopant is continuously available in the gas phase, a high doping of the sections of the semiconductor which form the bottom electrode in the finished capacitor can be achieved, since it is possible to set a high concentration of the dopant in particular at the interface between semiconductor and dielectric. However, this requires that those regions of the semiconductor which are intended to remain undoped are covered with a diffusion barrier.

During the fabrication of deep trench capacitors, firstly a collar made of silicon nitride is constructed in the upper section of the trench, to act as a diffusion barrier during the gas phase doping. To that end, the trench may, for example, firstly be filled with polysilicon, which is subsequently etched back isotropically as far as the lower edge of the collar to be fabricated. Afterward, a thin layer made of silicon nitride is deposited on the uncovered walls in the upper section of the trench. This ceramic material is generally deposited by a Chemical Vapor Deposition (CVD) or an Atomic Layer Deposition (ALD) method. Afterward, the silicon nitride layer deposited on the polysilicon filling is etched back anistropically, so that the silicon nitride layer only remains at the trench walls arranged perpendicular to the top side of the substrate and forms a collar there. As a result of the etching back of the silicon nitride layer, the top side of the filling made of polysilicon is uncovered again. The polysilicon is subsequently removed, thereby obtaining the original trench again, with a collar arranged at the upper termination of the trench wall adjacent to the opening of the trench with respect to the top side of the substrate. The uncovered substrate walls can then be doped by gas phase doping. Such a construction of a trench capacitor is also referred to as a "collar first" concept.

In the above procedure, difficulties arise when removing the filling made of polysilicon. On the one hand, it is desirable to remove the filling completely; on the other hand, however, the semiconductor substrate surrounding the filling should remain undamaged during the removal of the filling. To date, the problem has been solved by the trench firstly being completely lined with an etching stop layer, for example with a layer made of $Si_3N_4$. After the construction of the oxide collar, the polysilicon filling is then removed in a first step. In a second step, the etching stop layer is removed by etching the silicon nitride with aqueous phosphoric acid, for example. The selectivity between etching stop layer and the material of the collar is problematic in this case. The conditions for the removal of the etching stop layer therefore have to be controlled very precisely.

During chemical vapor deposition, a ceramic layer is fabricated in such a way that gaseous precursor compounds are fed to a substrate surface and said precursor compounds are deposited to form the ceramic material forming the ceramic layer. The precursor compound contains at least one element that is incorporated in the ceramic material, as well as reactive groups that enable a reaction with a further precursor compound. These groups may dissociate, for example, and the element contained in the precursor compound may be converted into the ceramic material. Chemical vapor deposition can essentially be carried out in two ways. In the first method, the precursor compounds of all the elements contained in the ceramic material are fed to the substrate surface simultaneously. The precursor compounds then react with one another at the substrate surface, and the ceramic material is deposited on the substrate surface. Layer thicknesses of up to a many micrometers can be produced in a relative short time by this method. However, difficulties may be caused by flow fluctuations in the reaction space, which lead to fluctuations in the thickness of the deposited layer. In order to achieve a layer thickness that is as uniform as possible, therefore, the reaction that proceeds during vapor deposition has been divided into a plurality of substeps.

In the ALD method, only a precursor compound of one element is adsorbed on the substrate surface to form a monomolecular layer. Generally, reactive groups are provided on the substrate surface, converting the precursor compound and irreversibly binding it in the process. The advantage of the ALD method is that it proceeds in self-limiting fashion, so that fluctuations in the process conditions do not lead to fluctuations in the thickness of the layer deposited on the substrate. The synthesis of a ceramic layer from monolayers results in a very time-consuming process. Furthermore, formation of a monomolecular layer should be as complete as possible in each case. In order to obtain a high conversion, and thus a high homogeneity of the layer, precursor compounds are therefore usually deposited at a relatively high temperature, generally at temperatures above 300° C.

In order to keep the thermal loading as low as possible during the fabrication of semiconductor elements, various low temperature ALD methods have been developed. These methods, employed at temperatures in the region of room temperature, enable deposition rates that achieved only at temperatures above 300° C. in previously used ALD methods.

In one low temperature ALD method, deposition of the precursor compounds is carried out under the action of a plasma. In this case, a portion of the molecules of at least one of the precursor compounds is converted with the aid of a plasma to form radicals having a very high reactivity. At as low a temperature as room temperature, the radicals react very rapidly with groups that are provided to the substrate surface. Such a method is described for example in U.S. Pat. No. 6,342,277 B1.

Another low temperature ALD method utilizes a catalyst in order to enable the deposition of the precursor compound to proceed at sufficiently high speed at as low a temperature as room temperature. In the latter method, although the catalyst participates in the deposition reaction, it does not itself undergo any change through the reaction. Such a method is described for example by J. W. Klaus, O. Sneh, A. W. Ott and S. M. George, Surface Review & Letters (1999), 435–448. In order to construct a ceramic layer comprising silicon dioxide, a small portion of pyridine is in each case added to the precursor compounds $SiCl_4$ and $H_2O$. Through the catalytic effect of the pyridine, the deposition of the precursor compounds proceeds at sufficiently high speed even at temperatures in the region of room temperature.

A further development of this method is reported by J.-E. Park, J.-H. Ku, J.-W. Lee, J.-H. Yang, K.-S. Chu, S.-H. Lee, M.-H. Park, N.-I. Lee, H.-K. Kang and K.-P. Suh (IEEE 2002). The latter report describes the use of $Si_2Cl_6$ (HCD) as silicon-containing precursor compound. Pyridine is likewise used as catalyst, and water as precursor compound for oxygen. In the above process, uniform layers of high quality can be fabricated at high deposition rates. Changes shown from here on.

SUMMARY

An embodiment of the present invention includes a method for fabricating patterned ceramic layers on inner surface areas of a relief structure in a substrate. Preferably the relief structure is arranged essentially perpendicular to a substrate surface, for simple fabrication of an oxide collar for use in the fabrication of trench capacitors.

In a preferred embodiment, the method includes a first step in which relief structures such as trenches are formed in a semiconductor substrate with the internal areas arranged essentially perpendicular to the top side of the substrate. In a subsequent step, a resist layer fills the structures up to a specific relief depth. Subsequently, deposition of a ceramic layer by means of a low temperature ALD method is performed at a temperature which is chosen to be lower than the softening temperature of the resist. Preferably, in a further step, anisotropic etching of the ceramic layer is performed, so that the ceramic layer remains only at the areas that are perpendicular to the top side of the substrate. In so doing, a top side of the resist layer is situated below the ceramic layer is uncovered, at least in sections. Subsequently, the resist can be removed by conventional means.

DETAILED DESCRIPTION OF THE PREFERRED EMBODIMENTS

The following list of reference symbols is used consistently in the discussion to follow.

Figure 1:
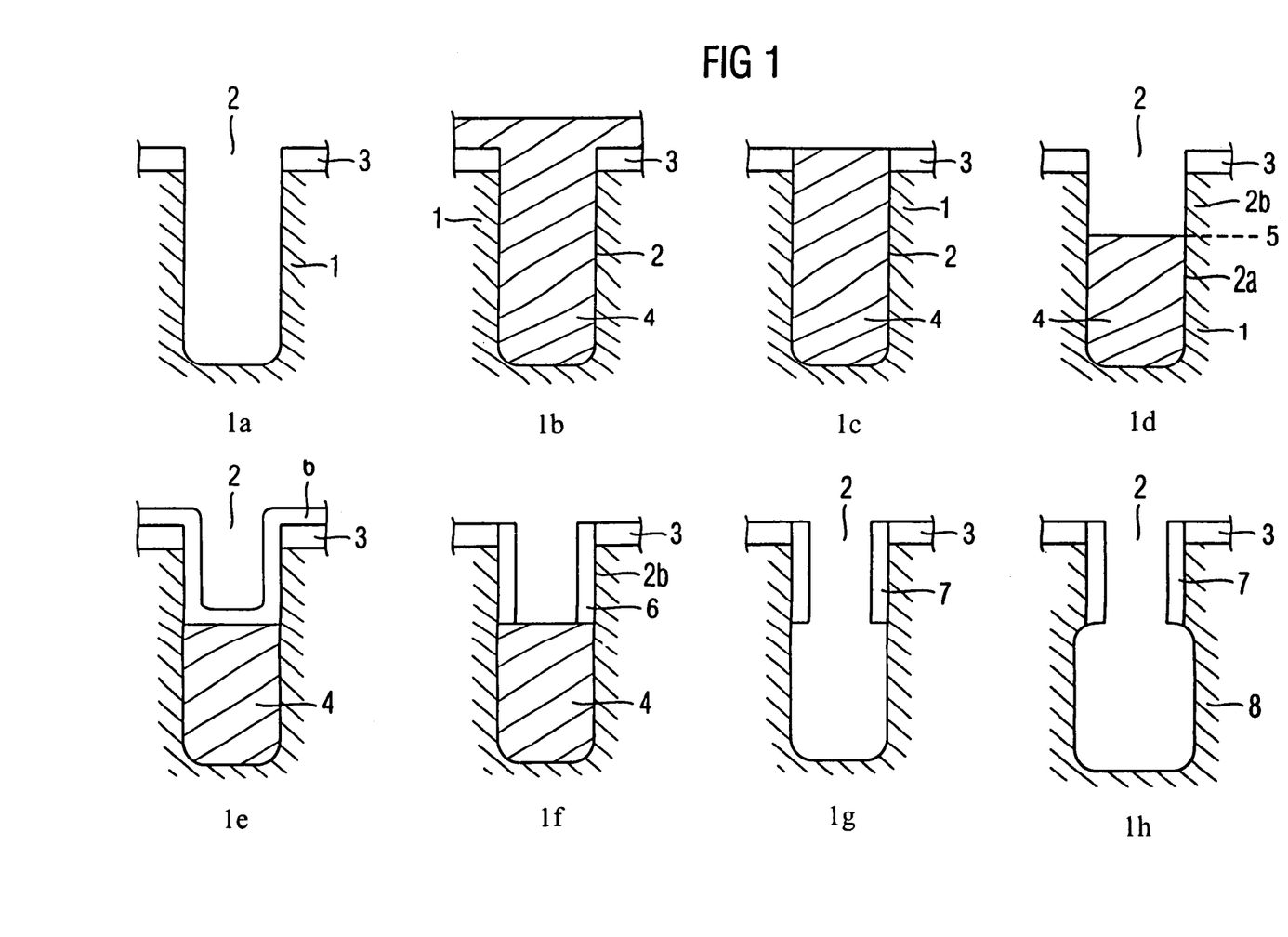
FIGS. 1a–1h illustrate diagrammatically steps for fabricating an oxide collar according to an exemplary embodiment of the present invention.

List of reference symbols
1 Semiconductor substrate
2 Trenches
3 Covering layer
4 Resist
5 Relief depth
6 Oxide layer
7 Collar
8 Doped region
9 Reaction space
10 Semiconductor substrate
11 Pump
12 First valve
13 Feed line
14 Supply container for first precursor compound
15 Supply container for second precursor compound
16 Supply container for catalyst
17 Second valve
18 Third valve
19 Fourth valve
20 Mixing chamber
21 Supply container for first precursor compound
22 Supply container for second precursor compound
23 Plasma chamber
24 Feed line FIGS. 1a to 1h diagrammatically illustrate steps for fabrication of an oxide collar in a trench, according to an exemplary embodiment of the present invention. In each step, a view is displayed of a section through a semiconductor substrate 1 into which a trench 1 is introduced. Semiconductor substrate 1 is covered with a covering layer 3 at its top side, wherein the covering layer may be constructed from silicon nitride, for example. An initial state is illustrated in FIG. 1a.

Trench 1 is then filled completely with a resist 4. As illustrated in FIG. 1b, the resist layer surface generally does not coincide with the upper edge of trench 2, rather portions of resist layer 4 are also arranged on the top side of semiconductor substrate 1 or covering layer 3. In order to achieve a uniform removal of resist layer 4 to a desired relief depth during the etching-back process, resist layer 4 is firstly planarized. This may be done by means of a conventional CMP method. In the arrangement as illustrated in FIG. 1c, resist layer 4 is removed down to the level of the top side of covering layer 3. However, the planarization of resist layer 4 can also be terminated even earlier, so that a uniformly thick resist layer also remains on the top side of covering layer 3. Resist layer 4 is then etched back isotropically as far as a relief depth 5 by means of an oxygen plasma, as illustrated in FIG. 1d. Below relief depth 5, wall 2a of trench 2 is covered by resist layer 4, while trench wall 2b is uncovered above relief depth 5. A conformal oxide layer 6 is then deposited on the uncovered areas, as illustrated in FIG. 1e. According to an exemplary embodiment of the present invention, a low temperature ALD method is used to grow the oxide. In order to form an oxide collar, portions of oxide layer 6 which are arranged on the top side of covering layer 3 and the top side of resist layer 4 are then removed in an anisotropic etching step. After the etching step, as illustrated in FIG. 1f, only the perpendicular portions of oxide layer 6 remain at walls 2b of trench 2. Thus, the lower termination of the perpendicular sections of oxide layer 6 is defined by the top side of resist layer 4. After ceramic layer 6 has been removed on the top side of resist layer 4, resist layer 4 can be removed. For example, an oxygen-containing plasma may be used for this purpose, whereby the constituents of resist layer 4, generally an organic polymer, are converted into gaseous constituents.

After the removal of resist layer 4, lower regions of the walls of trench 2, as illustrated in FIG. 1g, are uncovered. A collar 7 is formed in the upper section of trench 2. Further fabrication of the trench capacitor is carried out in a customary manner. For example, the lower section of trench 2 may be expanded by an etching method (wet bottle etch). A doped region 8 may be subsequently produced by gas phase doping, which forms a bottom electrode in the completed capacitor, as illustrated in FIG. 1h. Trench 2 has a collar 7 made of a ceramic material in its upper section and has been expanded in its lower section. Doping has been introduced in regions 8 adjoining the trench wall. The completion of the trench capacitor proceeds in a conventional manner. In trench 2, a dielectric is deposited in the form of a thin layer and a counter electrode is subsequently produced by filling the residual cavity of trench 2 with polysilicon, for example (not illustrated).

Figure 2:
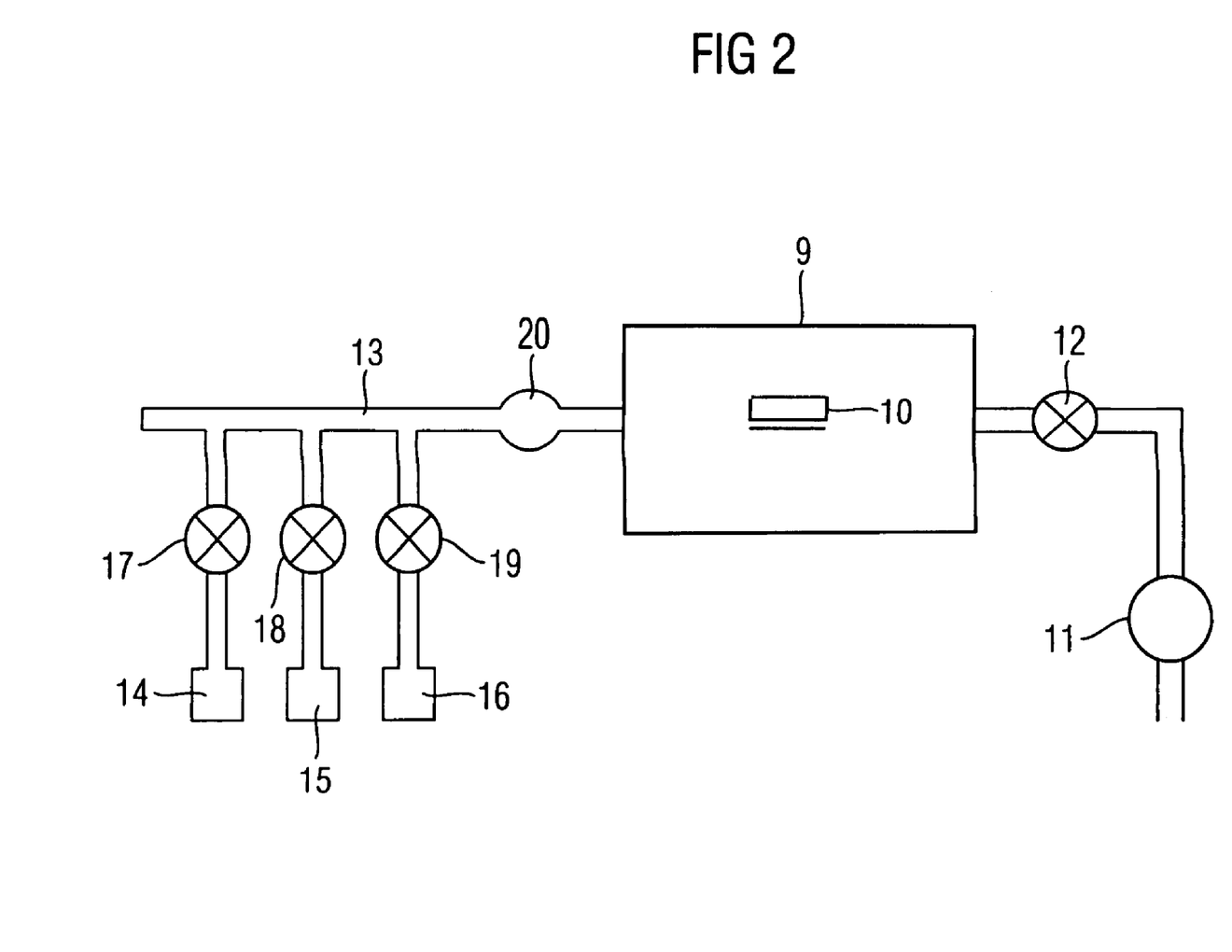
FIG. 2 depicts a diagrammatic illustration of an apparatus for carrying out a catalytic low temperature ALD method.

FIG. 2 diagrammatically depicts constituent parts of an apparatus that may be utilized for the deposition of a ceramic layer by means of a catalytic low temperature ALD method. A semiconductor substrate 10 is arranged in a reaction space 9, at the top side of which semiconductor substrate a relief structure is introduced, for example in the form of trenches. Reaction space 9 may also be equipped with a heating arrangement (not illustrated) to heat semiconductor substrate 10 to a desired temperature. It is possible to use customary heating equipment. Thus, the apparatus for fixing semiconductor substrate 10 may be provided with a heating arrangement. However, it is also possible to provide lamps, so that the semiconductor substrate can be heated to the desired temperature by irradiation with light.

Reaction space 9 can be evacuated with the aid of a pump 11, which can be connected to reaction space 9 or be disconnected therefrom via a first valve 12. Precursor compounds can be fed to reaction space 9 via a feed line 13. Supply containers 14, 15, and 16, for first precursor compound, second precursor compound and catalyst, respectively, are provided for this purpose. The supply containers can be connected to feed line 13 via valves 17, 18, and 19. In a mixing chamber 20, the individual components can be mixed before they are subsequently introduced into reaction space 9.

The course of the deposition is explained with reference to FIGS. 3a–d, and 4, which illustrate the opening states of valves 12, 17, 18, and 19. State 1 in this case corresponds to an open valve, while state 0 corresponds to a closed valve. Time is plotted on the X axis. The illustration comprises a cycle. FIG. 3a corresponds to the switching state of valve 12, FIG. 3b corresponds to the switching state of valve 17, FIG. 3c corresponds to the switching state of valve 18 and FIG. 3d corresponds to the switching state of valve 19.

At the beginning of a cycle, reaction space 9 is evacuated, by opening valve 12, so that pump 11 is connected to reaction space 9. After valve 12 has been closed, valves 17 and 19 are opened, so that first precursor compound from supply container 14 and catalyst from supply container 16 can flow into feed line 13 and be mixed in mixing chamber 20. Afterward, the mixture flows into reaction space 9, the first precursor compound being adsorbed on the surface of substrate 10. Valves 17 and 19 are then closed again and valve 12 is opened, so that non-adsorbed first precursor compound and catalyst are pumped away from reaction space 9. Valve 12 is then closed and valve 18 and also valve 19 are opened. A second precursor compound from supply vessel 15 and catalyst from supply vessel 16 then flow into feed line 13 and are mixed in mixing chamber 20 before they are introduced into reaction space 9. The second precursor compound can then be deposited on surface of substrate 10, where it reacts with the previously deposited first precursor compound to form the ceramic material under the action of the catalyst. This concludes an individual cycle. At the beginning of the next cycle, valve 18 and valve 19 are then closed again and valve 12 is opened in order to remove unbound second precursor compound and the catalyst from reaction space 9.

In the above method, the reaction space is evacuated between individual production steps in order to remove excess precursor compound. As an alternative, the reaction space may also be flushed with an inert flushing gas, e.g. nitrogen, between individual production steps. This is advantageous particularly in the case of larger installations that are used in production, since unreacted precursor compounds can be completely removed from the reaction space in a very simple manner by adapting the flushing time. In the case of flushing with a flushing gas, it is particularly advantageous that pressure fluctuations are avoided in the reaction space. In this case, the deposition of the ceramic layer is carried out in such a way that approximately the same pressure prevails in reaction space 10 in all the production steps. Flushing gas is then dispelled from the reaction space by the introduction of a precursor compound. The flushing step may also be carried out so that, at the end of the flushing step, the residual flushing gas is removed by evacuation from reaction space 10 and only then is the respective precursor compound introduced into reaction space 10.

A further method for depositing the ceramic layer at low temperatures comprises accelerating the deposition by producing radicals. The essential constituent parts of an apparatus suitable for carrying out a plasma-enhanced ALD method are illustrated diagrammatically in FIG. 4. Once again a semiconductor substrate 10 is arranged in a reaction space 9. As depicted previously in FIG. 2, a heating arrangement (not illustrated) may be provided to heat semiconductor substrate 10 to a desired temperature. A pump 11 is connected to reaction space 9 via a first valve 12. Depending on the switching state of valve 12, pump 11 can be connected to the reaction space or be disconnected therefrom. First precursor compound and second precursor compound can be fed to reaction space 9 via a feed line 13. Corresponding supply containers 21, used for the first precursor compound and 22, used for the second precursor compound, are provided for this purpose. Supply containers 21 and 22 can be connected to feed line 13 via corresponding valves 23, 24. A plasma chamber 25 for producing a plasma is furthermore provided. From plasma chamber 25, the plasma produced is fed to reaction space 9 via feed line 26.

The method steps are explained in more detail with reference to FIGS. 5a–d. FIG. 5a shows the switching state of valve 12, FIG. 5b shows the switching state of valve 23, FIG. 5c shows the switching state of valve 24 and FIG. 5d shows the switching state of a radio frequency coil by means of which a plasma is produced in plasma chamber 25. A cycle is illustrated in each case. A state 1 corresponds to an open valve or a switched-on RF coil; a state 0 corresponds to a closed valve or a switched-off RF coil.

Firstly, reaction space 9 is evacuated by opening valve 12, so that reaction space 9 is connected to pump 11. Valve 12 is closed and valve 23 is opened, so that first precursor compound from supply vessel 21 can flow into reaction space 9 via feed line 13. At the same time, the RF coil of the plasma chamber 23 is switched on, so that a plasma is produced. The plasma produces radicals from the first precursor compound, which radicals are adsorbed at the surface of substrate 10 and react with groups that are ready there. Valve 23 is then closed, the RF coil of plasma chamber 23 is switched off and valve 12 is opened in order to remove unbound first precursor compound from reaction space 9. In the next step, valve 12 is closed again and valve 24 is opened, so that second precursor compound from supply container 22 is introduced into reaction space 9 via feed line 13. At the same time, the RF coil of plasma chamber 23 is switched on, so that a plasma is produced again. The radicals produced from the second precursor compound react with the molecules of the first precursor compound which are adsorbed on the surface of substrate 10, so that a ceramic material is produced. At the beginning of the next cycle, valve 23 is closed, the RF coil of plasma chamber 23 is switched off and valve 12 is opened, so that unbound second precursor compound is removed from reaction space 9.

Figure 3:
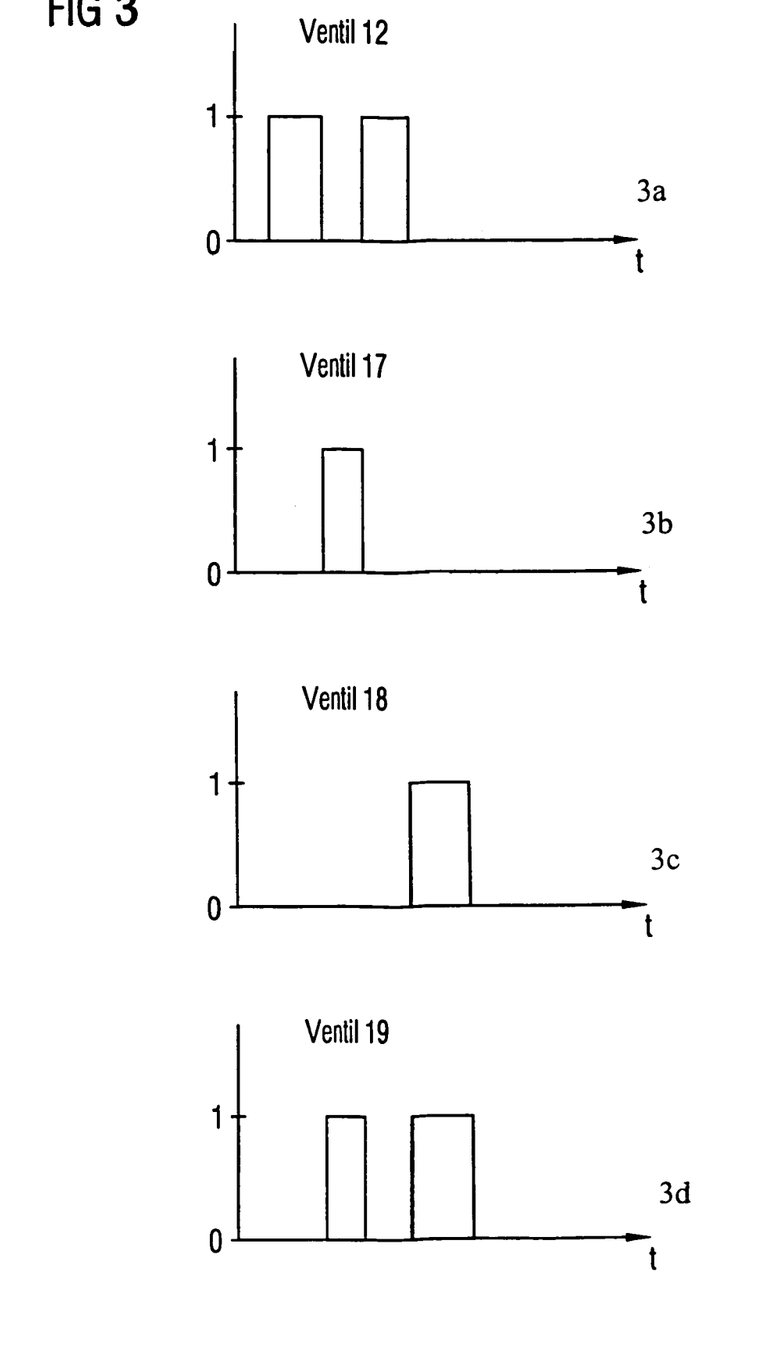
FIGS. 3a–3d depict a diagrammatic illustration of the process implementation for the catalytic ALD method.
Figure 4:
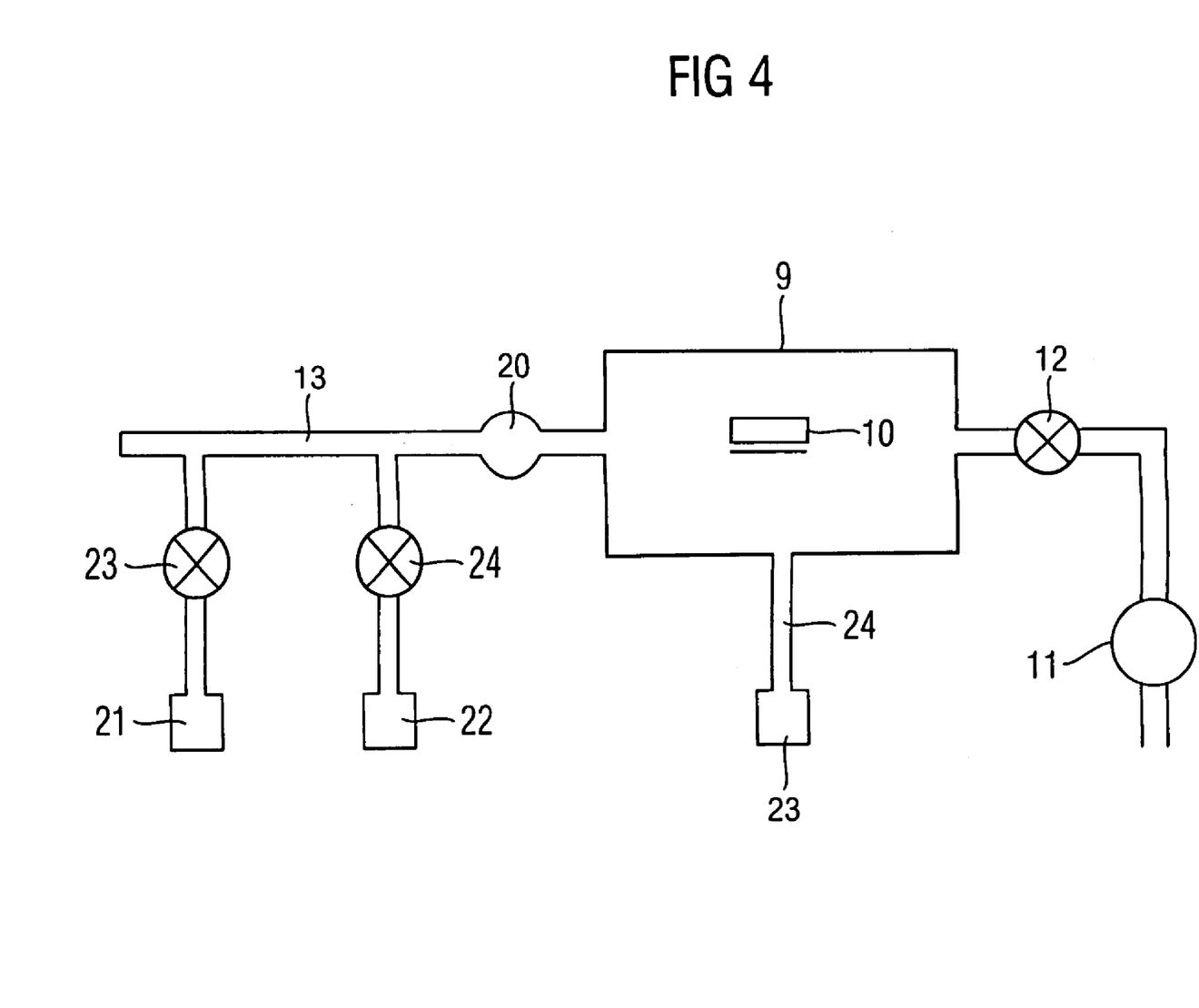
FIG. 4 depicts a diagrammatic illustration of an apparatus for carrying out a plasma-enhanced ALD method.
Figure 5:
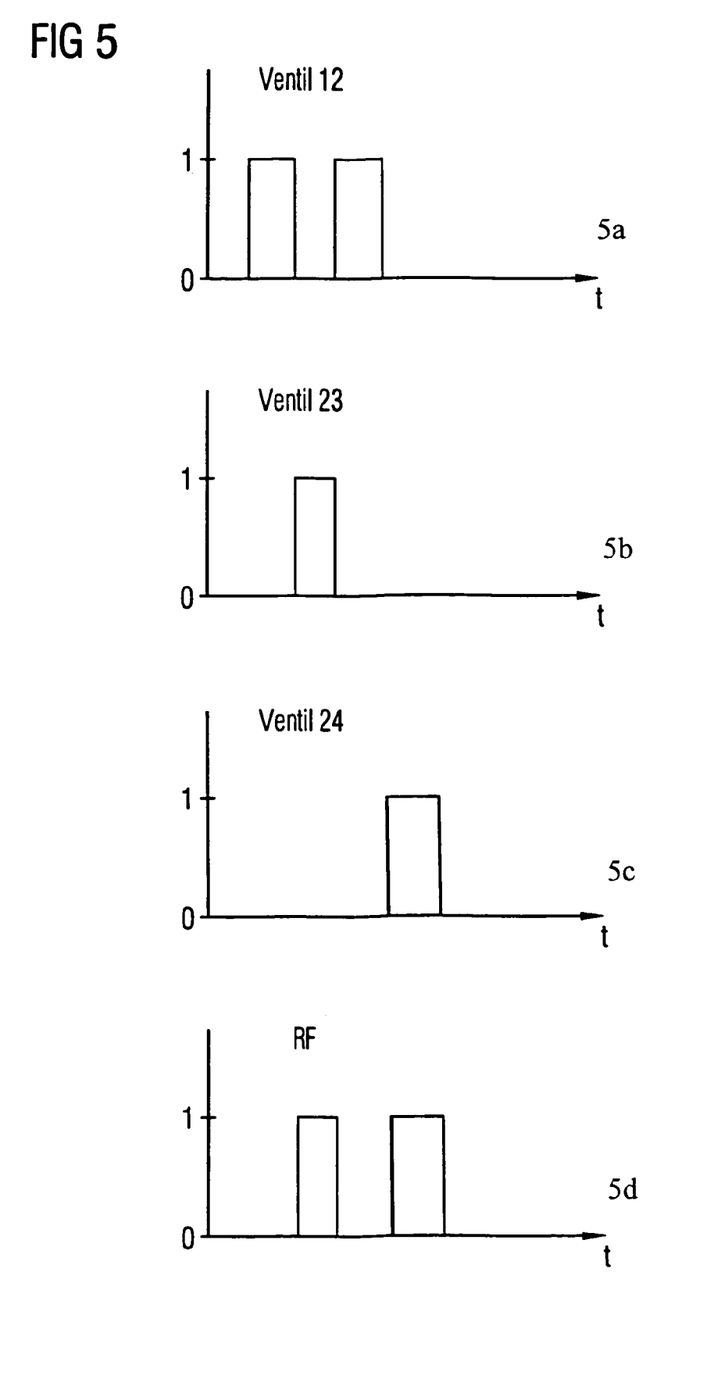
FIGS. 5a–5d depicts a diagrammatic illustration of the process sequence for the plasma-enhanced ALD method.

The cycles shown in FIGS. 3 and 5 are in each case repeated until the desired thickness of the ceramic layer is reached.

As depicted in FIGS. 2 and 3 the pumping away of unreacted precursor compounds may be replaced by a flushing step in which reaction space 10 is flushed with an inert flushing gas, such as nitrogen or a noble gas. Thus, it is possible to avoid pressure fluctuations in reaction space 10.

Accordingly, an embodiment of the present invention uses a resist as filling material. Such resists contain organic materials, usually organic polymers, which can be removed from a substrate surface without any residue under mild conditions, for example by stripping using a suitable solvent or by incineration using an oxygen plasma. Owing to the mild conditions, the semiconductor substrate is not damaged during the removal of the resist layer. In a preferred embodiment, suitable resists include conventional resists already used for the fabrication of semiconductor components, for example, for the fabrication of etching masks, or as a dielectric between conductive layers. The resist layer can be applied by customary methods, for example by spinning-on, and can also be removed again from the substrate surface by customary methods.

In order to avoid a high thermal loading during the fabrication of a patterned ceramic layer, such as an oxide collar, for example, which would lead to destruction of the resist layer, a low temperature ALD method is used for fabricating the patterned ceramic layer. Such low temperature ALD methods can be carried out with a sufficiently high deposition rate at as low a temperature as room temperature, so that there is no need to fear any damage to the resist layer during the deposition of the ceramic layer.

A ceramic material is understood to be an inorganic dielectric which can be applied in thin layers and can be arranged as an insulator between electrically conductive layers. In general, metal oxides or metal nitrides are used as ceramic materials. Typical ceramic materials which are suitable for use in the method according to the invention are silicon oxide, silicon nitride or else aluminum oxide.

Specifically, the procedure is such that a relief structure is produced in a semiconductor substrate in a conventional manner. To that end, by way of example, a mask may be fabricated from a mask material on the top side of the semiconductor substrate and the structure defined by the mask may subsequently be transferred into the semiconductor substrate by means of an etching process. After the mask used for the etching has been removed, if appropriate, the relief is filled with resist up to a relief depth corresponding to the extent of the patterned ceramic layer to be fabricated. Thus, in the case of a trench capacitor, the upper section of the trench remains free, in which a collar is intended to be constructed. In this case, the relief depth corresponds to the lower edge of the collar. The resist layer serves as filling material or else mask, so that a layer made of a ceramic material can now be deposited in the upper region. To that end, use is made of a low temperature ALD method, the temperature used during the deposition being chosen to be lower than the softening temperature of the resist. If the resist softens during the deposition of the ceramic material, the lower edge defined by the termination of the resist layer is no longer defined in an unambiguous manner. The deposition of the ceramic layer is therefore preferably carried out at a temperature lying at least 30° C. below the softening temperature of the resist. The ceramic material is deposited over the whole area, that is to say, not only on the perpendicular areas of the relief, but also on the top side of the substrate and on the top side of the resist layer. These portions of the ceramic layer running essentially parallel to the top side of the substrate are subsequently removed again by means of an anisotropic etching step, which causes the top side of the resist layer to be uncovered, at least in sections. The resist layer can then be removed again from the lower section of the trench or the relief.

Very gentle methods which require only low temperatures can be used during the removal of the resist layer. The thermal loading on the semiconductor substrate is low as a result of this. Furthermore, there is no need for etching stop layers, as are needed in the case of a filling with polysilicon in order to avoid damage to the semiconductor substrate.

Thus, in preferred embodiments of the present invention, a first step comprises use of a resist layer as filling material, which can be removed under mild conditions. Secondly, a low temperature ALD method is used for the fabrication of the ceramic layer, so that only a low thermal loading occurs.

Any desired low temperature ALD methods may be used for the deposition of the ceramic layer. A method in which at least one of the precursor compounds is activated by the formation of radicals is suitable, by way of example. The radicals produced then react very rapidly with the other precursor compound adsorbed on the substrate surface. To that end, the semiconductor substrate is firstly arranged in a reaction space and a cycle is subsequently carried out, comprising the following steps: introduction of a first precursor compound into the reaction space, where the first precursor compound is adsorbed on the surface of the substrate; removal of excess unbound first precursor compound from the reaction space; introduction of a second precursor compound into the reaction space, where the second precursor compound is adsorbed on the surface of the substrate; removal of unbound second precursor compound from the reaction space; producing radicals from at least one portion of the first precursor compound and/or at least one portion of the second precursor compound, which radicals react with the precursor compound adsorbed on the substrate surface to form the ceramic material; and repeat of the above steps until a desired layer thickness of the ceramic layer is reached.

At least two precursor compounds are required for the fabrication of the ceramic material. In the case of a metal oxide, by way of example, the first precursor compound comprises a metal compound, while the second precursor compound contains oxygen. If the oxide layer is intended to comprise a plurality of metals, the cycle is extended by a corresponding number of steps in which corresponding precursor compounds are introduced into the reaction space. Exemplary embodiments of the present invention thus provide for producing patterned ceramic layers which, for example, comprise mixed oxides, meaning that they comprise more than one metal. The mixed oxide may have a homogeneous composition over the entire volume of the ceramic layer. It is also possible to deposit the individual metal oxides layer by layer, thereby obtaining a layer stack which, by way of example, comprises layers made of aluminum oxide and layers made of silicon dioxide.

The radicals are preferably produced with the aid of a plasma. In this case, the radicals may be produced in the entire reaction space or a chamber separate from the reaction space may also be provided for the production of the radicals, from which chamber the radicals are then fed to the reaction space. The above method may thus be carried out using customary ALD installations provided with an apparatus for producing a plasma. The production of the plasma is likewise carried out by customary methods. The conditions may be chosen to provide a sufficient number of radicals to achieve a sufficiently high deposition rate of the precursor compound even at low temperatures, so that a continuous monomolecular layer of the respective precursor compound is formed in time periods suitable for industrial application.

An individual step of the above-mentioned cycle in which a precursor compound is introduced into the reaction space and deposited may also be subdivided further. For example, the respective precursor compound may be deposited in a cycle, having the following steps: introduction of the precursor compound into the reaction space; production of radicals from at least one portion of the precursor compound; wherein the radicals react with the other precursor compound deposited on the substrate surface; and removal of unbound precursor compound from the reaction space; repeating the above steps at least once.

The radical-assisted low temperature ALD method makes it possible to deposit a large number of ceramic materials, such as oxides or nitrides, for example. This method is particularly preferable if the ceramic layer is constructed from $Al_2O_3$.

In accordance with a further embodiment, a low temperature ALD method is carried out using a catalyst. In the case of a catalytic ALD method, a semiconductor substrate is firstly arranged in a reaction space. A cycle is then carried out which comprises at least the following steps: introduction of a first precursor compound into the reaction space, wherein the first precursor compound is adsorbed on the surface of the substrate; removal of excess unbound first precursor compound from the reaction space; introduction of a second precursor compound into the reaction space, wherein the second precursor compound is adsorbed on the surface of the substrate; removal of unbound second precursor compound from the reaction space; and adding a catalyst to the first precursor compound and/or to the second precursor compound.

The deposition may be carried out either in such a way that only the deposition of one of the precursor compounds is catalyzed by a catalyst, or else such that the deposition of all the precursor compounds can be catalyzed by a catalyst. The ceramic material for example, an oxide, may contain only a single metal. However, it is also possible to provide a plurality of metals in the ceramic material, and thus form a mixed oxide.

A Lewis base, preferably an aromatic nitrogen base, may be used as a catalyst. In the case of an aromatic nitrogen base, the nitrogen is preferably arranged in the ring. Pyridine is particularly preferable for use as an aromatic nitrogen base.

The catalytic low temperature ALD method also enables a large number of ceramic materials to be deposited, such as metal nitrides or metal oxides. In preferred embodiments, the ceramic layer is synthesized from $SiO_2$, $Si_3N_4$, $Al_2O_3$ or a combination of these compounds. If a combination of these compounds is used, the ceramic layer may either be constructed homogeneously, or else be constructed as a stack of layers which are in each case inherently homogeneous.

In order to define the termination of the patterned ceramic layer, the relief is filled with the resist only as far as the lower edge of the patterned ceramic layer to be fabricated. In a preferred embodiment of the present invention, the relief is firstly filled completely with resist and the resist layer is subsequently removed as far as specific relief depth. The relief depth can be controlled with high accuracy in this way.

In order to be able to set a uniform relief depth in all the cutouts of the relief, in a preferred embodiment, the resist layer obtained is planarized after the relief has been completely filled with the resist. Conventional Chemical Mechanical Polishing (CMP) methods are used for this purpose.

In order to remove the resist layer again as far as the envisaged relief depth, the resist is preferably removed by means of an oxygen-containing plasma. This dry-chemical process gives rise only to gaseous products which can easily be discharged from the reaction space, so that they do not contaminate the substrate or the reaction space.

In order to minimize changes in the resist layer during processing, the resist layer is preferably baked before the deposition of the ceramic layer. Solvent residues still contained in the resist and further volatile constituents of the resist are driven out in the baking process.

In order to improve the quality of the patterned ceramic layer, a heat treatment step for densifying the ceramic layer is preferably carried out after the removal of the resist layer. Reactive groups which have still remained from the precursor compounds in the ceramic material can be removed during the heat treatment step. The ceramic layer is densified further by the heat treatment step, so that leakage currents which occur in the completed capacitor can be reduced to a very low level.

Embodiments of the present invention are particularly suitable for the fabrication of an oxide collar for a trench capacitor. For the fabrication of such trench capacitors, therefore, trenches having a high aspect ratio are formed in the substrate. The aspect ratio of such trenches is preferably chosen to be greater than 5:1, in particular greater than 50:1.

As already explained further above, one feature of a method according to the invention is the use of a low temperature ALD method. In order to combat a change in the resist layer, the deposition of the ceramic layer is therefore preferably carried out at a temperature of less than 100° C. The ceramic layer is particularly preferably deposited at room temperature.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for fabricating patterned ceramic layers on areas of a relief that are arranged essentially perpendicular to a substrate surface, comprising:
   providing a semiconductor substrate;
   forming relief structures which are trench structures formed within a top side of the substrate, wherein internal areas are arranged essentially perpendicular to the top side of the substrate;
   filling the relief structures with a resist in physical contact with the substrate within the trench structures and subsequently isotropically etching the resist to remove the resist to a relief depth, wherein a resist layer is obtained;
   depositing a ceramic layer synthesized from a ceramic material by means of a low temperature ALD method, wherein the low temperature ALD method is performed at a temperature lower than a softening temperature of the resist;
   anisotropic etching of the ceramic layer, wherein the ceramic layer remains at the areas arranged perpendicular to the top side of the substrate, and wherein a top side of the resist layer situated below the ceramic layer is at least partially uncovered; and
   subsequently removing the resist layer.

2. The method in claim 1, wherein the ceramic layer is deposited by a radical-assisted ALD method, in which the semiconductor substrate is arranged in a reaction space and a cycle is carried out, comprising:
   introducing a first precursor compound into a reaction space, wherein the first precursor compound is adsorbed on the surface of the substrate;
   removing unbound first precursor compound from the reaction space;
   introducing a second precursor compound into the reaction space, wherein the second precursor compound is adsorbed on the surface of the substrate; and
   removing unbound second precursor compound from the reaction space.

3. The method of claim 2, wherein radicals are produced from at least one portion of a first or a second precursor compound, wherein the radicals react with the precursor compound adsorbed on the substrate surface to form the ceramic material.

4. The method of claim 3, wherein the cycle is repeated until a desired layer thickness of the ceramic layer is reached.

5. The method of claim 3, wherein the radicals are produced by means of a plasma.

6. The method of claim 4, wherein the precursor compound is deposited in a cycle, comprising the following steps:
   introducing the precursor compound into the reaction space;
   producing radicals from at least one portion of the precursor compound, wherein the radicals react with the precursor compound deposited on the substrate surface; and
   removing unbound precursor compound from the reaction space,
   wherein the cycle is repeated at least once.

7. The method of claim 4, wherein the ceramic layer is constructed from $Al_2O_3$.

8. The method of claim 1, wherein the ceramic layer is produced by a catalytic ALD method, wherein the semiconductor substrate is arranged in a reaction space, and a cycle is carried out, comprising:
   introducing a first precursor compound into the reaction space, wherein the first precursor compound is adsorbed on the surface of the substrate;
   removing excess unbound first precursor compound from the reaction space;
   introducing a second precursor compound into the reaction space, wherein the second precursor compound is adsorbed on the surface of the substrate; and
   removing unbound second precursor compound from the reaction space, wherein a catalyst is added to at least one precursor compound, wherein the catalyst catalyses the reaction of the first precursor compound with the second precursor compound.

9. The method of claim 8, wherein the catalyst is an aromatic nitrogen base.

10. The method of claim 9, wherein the aromatic nitrogen base is pyridine.

11. The method of claim 8, wherein the ceramic layer is synthesized from $SiO_2$, $Si_3N_4$, $Al_2O_3$ or a combination of these compounds.

12. The method of claim 1, wherein filling the relief structures with a resist to a specific relief depth comprises:
   filling the relief structure completely with the resist; and
   removing the resist layer to the specific relief depth.

13. The method of claim 1, wherein the resist layer is planarized after the relief has been completely filled with the resist.

14. The method of claim 1, wherein the relief structures comprise high aspect ratio trenches.

15. The method of claim 1, wherein the trenches are functionally processed to produce capacitors.

* * * * *